US009583655B2

(12) United States Patent
Cheng

(10) Patent No.: US 9,583,655 B2
(45) Date of Patent: Feb. 28, 2017

(54) METHOD OF MAKING PHOTOVOLTAIC DEVICE HAVING HIGH QUANTUM EFFICIENCY

(71) Applicant: TSMC Solar Ltd., Taichung (TW)

(72) Inventor: Tzu-Huan Cheng, Kaohsiung (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 616 days.

(21) Appl. No.: 14/048,086

(22) Filed: Oct. 8, 2013

(65) Prior Publication Data

US 2015/0096609 A1 Apr. 9, 2015

(51) Int. Cl.
*H01L 31/0256* (2006.01)
*H01L 31/18* (2006.01)
*H01L 31/032* (2006.01)
*H01L 31/0749* (2012.01)

(52) U.S. Cl.
CPC ...... *H01L 31/0322* (2013.01); *H01L 31/0323* (2013.01); *H01L 31/0749* (2013.01); *H01L 31/1864* (2013.01); *Y02E 10/541* (2013.01); *Y02P 70/521* (2015.11)

(58) Field of Classification Search
CPC ............. H01L 31/0322; H01L 31/0323; H01L 31/0749; H01L 31/1864
See application file for complete search history.

(56) References Cited

U.S. PATENT DOCUMENTS

| 2002/0094593 A1* | 7/2002 | Chiou | G03F 7/091 438/29 |
| 2004/0063320 A1* | 4/2004 | Hollars | C23C 14/0057 438/689 |
| 2006/0088968 A1 | 4/2006 | Shin et al. | |
| 2007/0281172 A1* | 12/2007 | Couillard | H01L 21/268 428/446 |
| 2008/0295885 A1* | 12/2008 | Lee | C30B 13/24 136/256 |
| 2010/0032012 A1* | 2/2010 | Isaka | C23C 16/345 136/256 |
| 2010/0120263 A1* | 5/2010 | Hsueh | H01L 21/324 438/795 |

(Continued)

FOREIGN PATENT DOCUMENTS

| CN | 101414622 A | 4/2009 |
| CN | 102157615 A | 8/2011 |

(Continued)

OTHER PUBLICATIONS

U.S. Appl. No. 13/654,539 filed Oct. 18, 2012.

(Continued)

*Primary Examiner* — Susan D Leong
(74) *Attorney, Agent, or Firm* — Duane Morris LLP

(57) ABSTRACT

A method of fabricating a photovoltaic device includes forming an absorber layer comprising an absorber material above a substrate, forming a buffer layer over the absorber layer, forming a front transparent layer over the buffer layer, and exposing the photovoltaic device to heat or radiation at a temperature from about 80° C. to about 500° C. for a period of time, subsequent to the step of forming a buffer layer over the absorber layer.

15 Claims, 11 Drawing Sheets

(56) References Cited

U.S. PATENT DOCUMENTS

| | | | |
|---|---|---|---|
| 2010/0308376 A1* | 12/2010 | Takada | H01L 21/02381 |
| | | | 257/200 |
| 2011/0143480 A1* | 6/2011 | Hilali | H01L 21/324 |
| | | | 438/58 |
| 2011/0189816 A1 | 8/2011 | Kawano et al. | |
| 2012/0222742 A1 | 9/2012 | Nakagawa et al. | |
| 2013/0244370 A1 | 9/2013 | Tadakuma | |

FOREIGN PATENT DOCUMENTS

| | | |
|---|---|---|
| CN | 102484164 A | 5/2012 |
| EP | 1610395 A2 | 12/2005 |

OTHER PUBLICATIONS

U.S. Appl. No. 13/792,702 filed Mar. 11, 2013.
U.S. Appl. No. 13/936,376 filed Jul. 8, 2013.
Official Action issued Mar. 31, 2016 in counterpart Chinese patent application No. 2016032801726040.
Official Action issued Mar. 31, 2016 in counterpart Chinese patent application No. 2016032801712410.
Qian, Q. , "Process Research and Fabrication of CIGS Thin Film Solar Cell", Master Degree Thesis Paper, Jun. 30, 2011, 39 pages. Partial translation included.

* cited by examiner

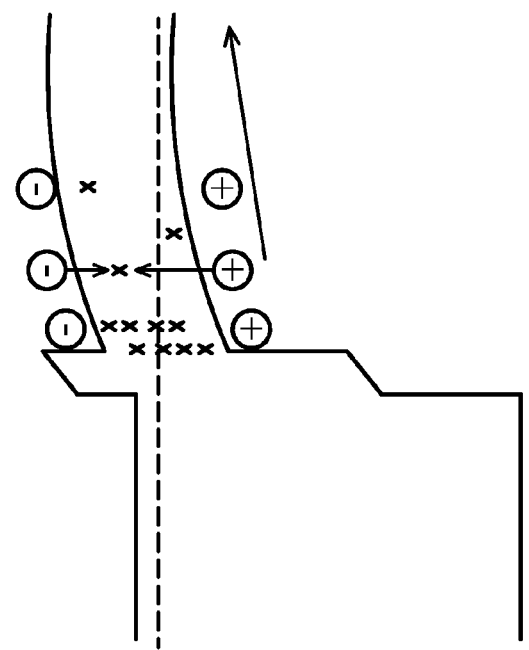
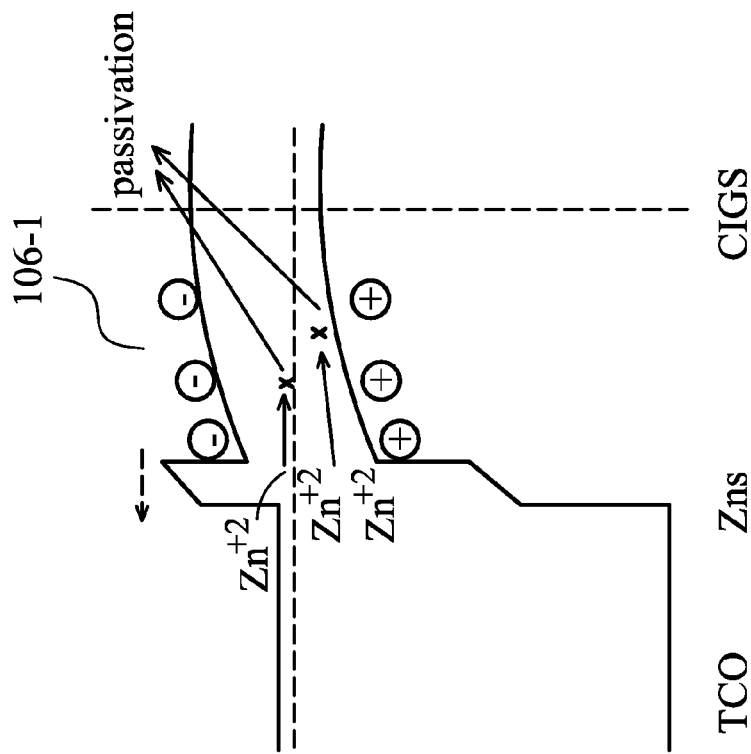
FIG. 5A
FIG. 5B

METHOD OF MAKING PHOTOVOLTAIC DEVICE HAVING HIGH QUANTUM EFFICIENCY

FIELD

The disclosure relates to photovoltaic devices generally, and more particularly relates to a method for making a photovoltaic device having high quantum efficiency, and the resulting photovoltaic device.

BACKGROUND

Photovoltaic devices (also referred to as solar cells) absorb sun light and convert light energy into electricity. Photovoltaic devices and manufacturing methods therefore are continually evolving to provide higher conversion efficiency with thinner designs.

Thin film solar cells are based on one or more layers of thin films of photovoltaic materials deposited on a substrate. The film thickness of the photovoltaic materials ranges from several nanometers to tens of micrometers. Examples of such photovoltaic materials include cadmium telluride (CdTe), copper indium gallium selenide (CIGS) and amorphous silicon (α-Si). These materials function as light absorbers. A photovoltaic device can further comprise other thin films such as a buffer layer, a back contact layer, and a front contact layer.

BRIEF DESCRIPTION OF THE DRAWINGS

The present disclosure is best understood from the following detailed description when read in conjunction with the accompanying drawings. It is emphasized that, according to common practice, the various features of the drawings are not necessarily to scale. On the contrary, the dimensions of the various features are arbitrarily expanded or reduced for clarity. Like reference numerals denote like features throughout specification and drawings.

FIGS. 5A and 5B illustrate a process of passivation in the junction after thermal or radiation treatment.

DETAILED DESCRIPTION

Figure 1A:
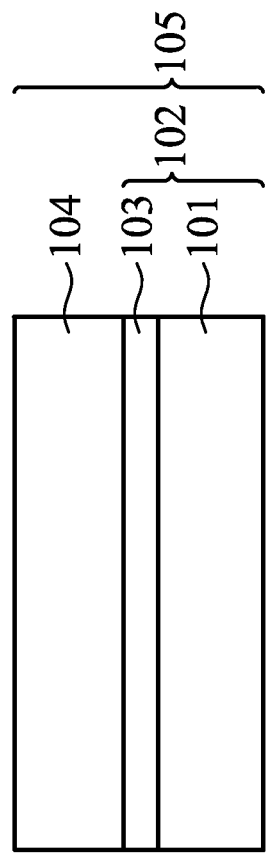
FIGS. 1A-1E are cross-sectional views of a portion of an exemplary photovoltaic device during fabrication, in accordance with some embodiments.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

The quantum efficiency (QE), or incident photon to converted electron (IPCE) ratio, of a photosensitive device such as a solar cell, a photodiode and an image sensor is the percentage of photons incident to the device's photoreactive surface that produce charge carriers. QE indicates electrical sensitivity of the device to light. Internal Quantum Efficiency (IQE) is the ratio of the number of charge carriers collected by the solar cell to the number of photons that shine on the photovoltaic device from outside and are absorbed by the photovoltaic device.

In a thin-film photovoltaic device, a buffer layer comprising a suitable buffer material is disposed above an absorber layer. The buffer layer and the absorber layer, which both comprises a semiconductor material, provide a p-n or n-p junction. When the absorber layer absorbs sun light, electric current can be generated at the p-n or n-p junction. However, charge recombination causes a drop in the quantum efficiency.

This disclosure provides a method for fabricating a photovoltaic device, and a resulting photovoltaic device such as a thin film solar cell having high internal quantum efficiency. The internal quantum efficiency of the photovoltaic device is improved through passivation of the junction and an increase in the depletion region in the p-n or n-p junction formed between the absorber layer and the buffer layer. Thermal energy or radiation excitation (or both) is used to provide controlled ion diffusion from the buffer layer to the absorber layer to decrease or eliminate defects and resulting recombination.

In FIGS. 1A-1E, like items are indicated by like reference numerals, and for brevity, descriptions of the structure, provided above with reference to the previous figures, are not repeated. The method described in FIG. 2 is described with reference to the exemplary structure described in FIGS. 1A-1E.

Figure 1B:
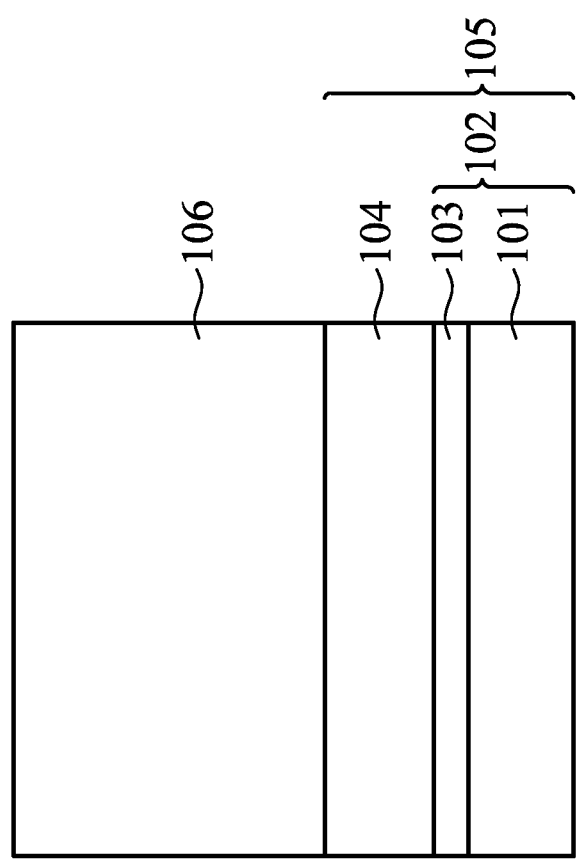
Figure 1C:
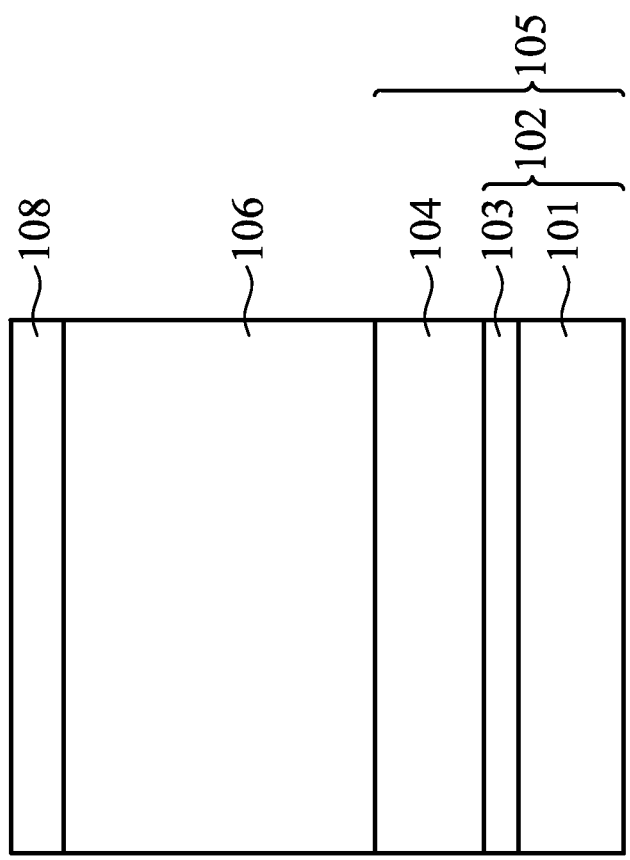
Figure 1D:
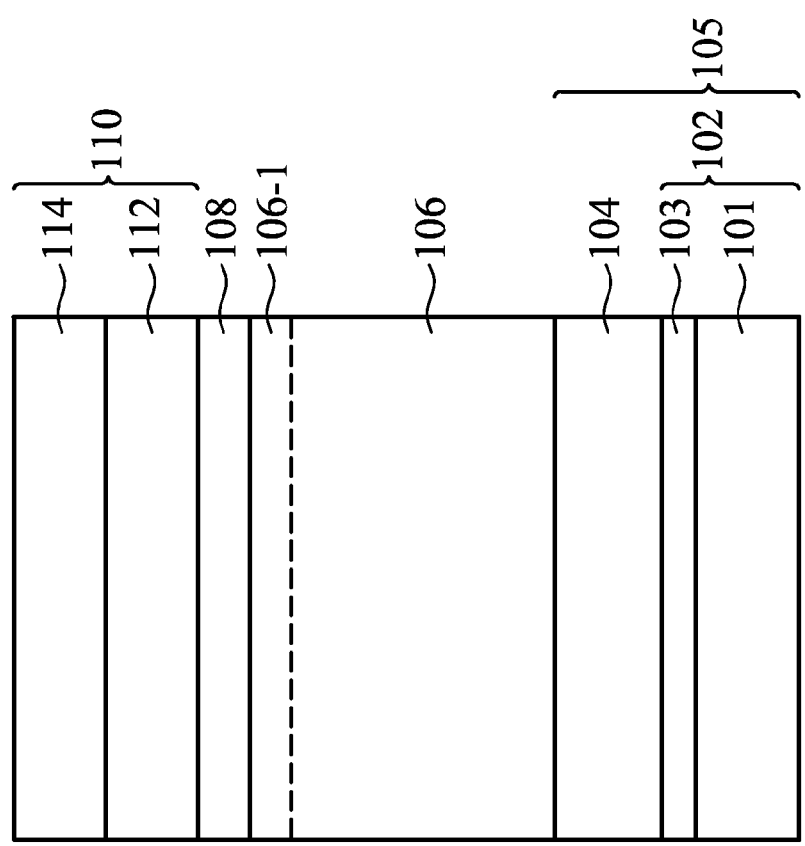
Figure 1E:
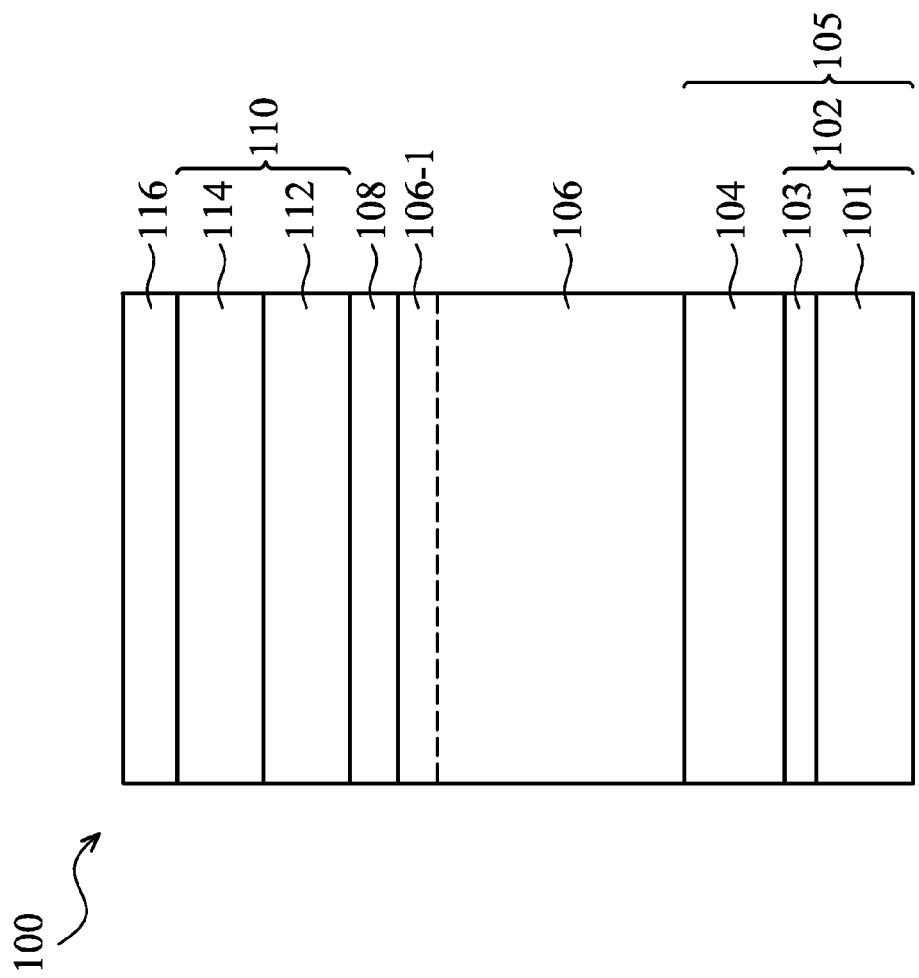
Figure 2:
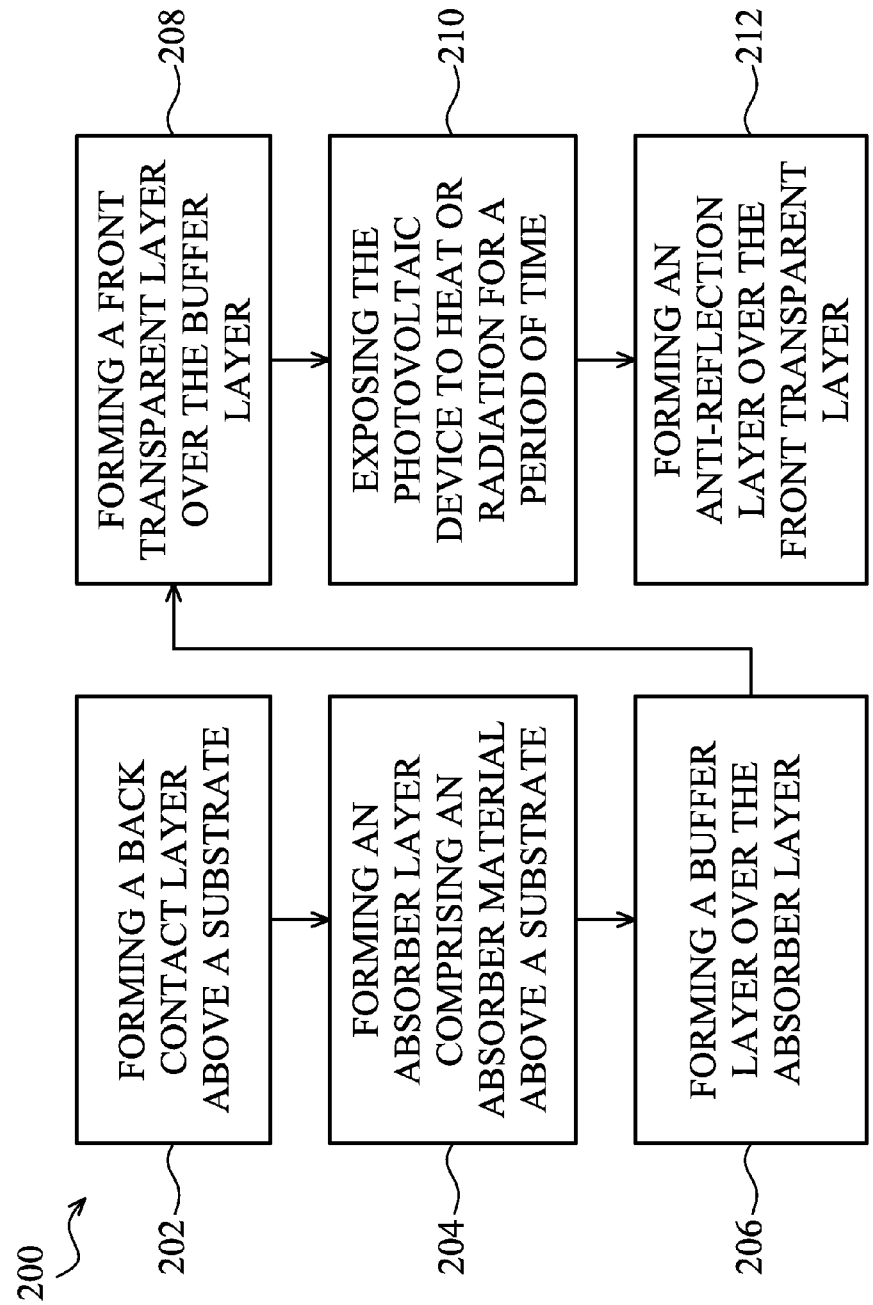
FIG. 2 is a flow chart diagram illustrating a method of fabricating an exemplary photovoltaic device in accordance with some embodiments.

FIG. 2 illustrates an exemplary method 200 of fabricating an exemplary photovoltaic device 100 in accordance with some embodiments. FIGS. 1A-1E are cross-sectional views of a portion of an exemplary photovoltaic device 100 during fabrication in accordance with some embodiments.

At step 202, a back contact layer 104 is formed above a substrate 102. The resulting structure of a portion of a photovoltaic device 100 is illustrated in FIG. 1A.

Substrate 102 and back contact layer 104 are made of any material suitable for such layers in thin film photovoltaic devices. Examples of materials suitable for use in substrate 102 include but are not limited to glass (such as soda lime glass), polymer (e.g., polyimide) film and metal foils (such as stainless steel). The film thickness of substrate 102 is in any suitable range, for example, in the range of 0.1 mm to 5 mm in some embodiments.

In some embodiments, substrate 102 can comprise two or more layers as shown in FIG. 1A. Substrate 102 of FIG. 1A includes a layer 101 comprising glass, and a layer 103 comprising silicon dioxide, which can be used to block possible diffusion of sodium in layer 101 comprising glass.

In some embodiments, layer 101 comprises soda lime glass or other glass, which can tolerate a process at a temperature higher than 600° C. In some embodiments, layer 103 comprises silicon oxide having a formula $SiO_x$, where x ranges from 0.3 to 2.

Examples of suitable materials for back contact layer 104 include, but are not limited to molybdenum (Mo), copper, nickel, or any other metals or conductive material. Back contact layer 104 can be selected based on the type of thin film photovoltaic device. For example, in a CIGS thin film photovoltaic device, back contact layer 104 is Mo in some embodiments. In a CdTe thin film photovoltaic device, back contact layer 104 is copper or nickel in some embodiments. The thickness of back contact layer 104 is on the order of nanometers or micrometers, for example, in the range from 100 nm to 20 microns. The thickness of back contact layer 104 is in the range of from 200 nm to 10 microns in some embodiments. Back contact layer 104 can be also etched to form a pattern.

At step 204, an absorber layer 106 comprising an absorber material is formed above back contact layer 104 and above substrate 102. The resulting structure of photovoltaic device 100 is illustrated in FIG. 1B.

Absorber layer 106 is a p-type or n-type semiconductor material. Examples of materials suitable for absorber layer 106 include but are not limited to cadmium telluride (CdTe), copper indium gallium selenide (CIGS), and amorphous silicon (α-Si). Absorber layer 106 can comprise material of a chalcopyrite family (e.g., CIGS) or kesterite family (e.g., BZnSnS and CZTS). In some embodiments, absorber layer 106 is a semiconductor comprising copper, indium, gallium and selenium, such as $CuIn_xGa_{(1-x)}Se_2$, where x is in the range of from 0 to 1. In some embodiments, absorber layer 106 is a p-type semiconductor comprising copper, indium, gallium and selenium. Absorber layer 106 has a thickness on the order of nanometers or micrometers, for example, 0.5 microns to 10 microns. In some embodiments, the thickness of absorber layer 106 is in the range of 500 nm to 2 microns.

Absorber layer 106 can be formed according to methods such as sputtering, chemical vapor deposition, printing, electrodeposition or the like. For example, CIGS is formed by first sputtering a metal film comprising copper, indium and gallium at a specific ratio, followed by a selenization process of introducing selenium or selenium containing chemicals in gas state into the metal firm. In some embodiments, the selenium is deposited by evaporation physical vapor deposition (PVD).

Unless expressly indicated otherwise, references to "CIGS" made in this disclosure will be understood to encompass a material comprising copper indium gallium sulfide and/or selenide, for example, copper indium gallium selenide, copper indium gallium sulfide, and copper indium gallium sulfide/selenide. A selenide material may comprise sulfide or selenide can be completely replaced with sulfide.

In some embodiments, the absorber material in absorber layer 106 is selected from the group consisting of copper indium gallium selenide (CIGS) and cadmium telluride (CdTe). The absorber material is a p-type semiconductor. In some embodiments, the absorber material in absorber layer 106 can also be $CuInSe_2$, $CuInS_2$, or $CuGaSe_2$.

At step 206, a buffer layer 108 is formed over absorber layer 106. The resulting structure of a portion of the photovoltaic device 100 during fabrication after step 206 is illustrated in FIG. 1C. Buffer layer 108 comprises a buffer material selected from the group consisting of ZnS, CdS and CdSe in some embodiments. Such a buffer material is an n-type semiconductor in some embodiments.

Examples of buffer layer 108 include but are not limited to CdS, ZnS ZnO, ZnSe, $ZnIn_2Se_4$, $CuGaS_2$, $In_2S_3$, MgO and $Zn_{0.8}Mg_{0.2}O$, in accordance with some embodiments. The thickness of buffer layer 108 is on the order of nanometers, for example, in the range of from 5 nm to 100 nm in some embodiments.

Formation of buffer layer 108 is achieved through a suitable process such as sputtering or chemical vapor deposition. For example, in some embodiments, buffer layer 108 is a layer of CdS, ZnS or a mixture of CdS and ZnO, deposited through a hydrothermal reaction or chemical bath deposition (CBD) in a solution. For example, in some embodiments, a buffer layer 108 comprising a thin film of ZnS is formed above absorber layer 106 comprising CIGS.

Buffer layer 108 is formed in an aqueous solution comprising $ZnSO_4$, ammonia and thiourea at 80° C. A suitable solution comprises 0.16M of $ZnSO_4$, 7.5M of ammonia, and 0.6 M of thiourea in some embodiments.

At step 208, a front transparent layer 110 is formed over buffer layer 108. The resulting structure of a portion of photovoltaic device 100 is illustrated in FIG. 1D.

As a part of "window layer," front transparent layer 110 can comprise two layers including a layer 112 comprising intrinsic ZnO (i-ZnO) and a front contact layer 114 comprising transparent conductive oxide (TCO) or any other transparent conductive coating in some embodiments.

In some embodiments, layer 112 in front transparent layer 110 is made of undoped i-ZnO, which is used to prevent short circuiting in the photovoltaic device 100. In thin film solar cells, film thickness of absorber layer 106 comprising an absorber material such as CdTe and copper indium gallium selenide (CIGS) ranges from several nanometers to tens of micrometers. Other layers such as buffer layer 108, back contact layer 104, and front contact layer 114 comprising a transparent conductive coating are even thinner in some embodiments. If front contact layer 114 and back contact layer 104 are unintentionally connected because of defects in the thin films, an unwanted short circuit (shunt path) will be provided. Such phenomenon decreases performance of the photovoltaic devices, and can cause the devices to fail to operate within specifications. The loss of efficiency due to the power dissipation resulting from the shunt paths can be up to 100%. In some embodiments, layer 112 comprising intrinsic zinc oxide (i-ZnO) without any dopants is thus provided in between the front- and the back contact layers to prevent short circuiting, for example, above buffer layer 108, between the buffer layer 108 and the front contact layer. Intrinsic ZnO having high electrical resistance can mitigate the shunt current and reduce formation of the shunt paths.

Front contact layer 112, which is a transparent conductive layer, is used in a photovoltaic (PV) device with dual functions: transmitting light to an absorber layer while also serving as a front contact to transport photo-generated electrical charges away to form output current. Transparent conductive oxides (TCOs) are used as front contacts in some embodiments. In some other embodiments, front contact layer 112 is made of a transparent conductive coating comprising nanoparticles such as metal nanoparticles or nanotube such as carbon nanotubes (CNT). Both high electrical conductivity and high optical transmittance of the transparent conductive layer are desirable to improve photovoltaic efficiency.

Examples of a suitable material for the front contact layer or transparent conductive layer 112 include but are not limited to transparent conductive oxides such as indium tin oxide (ITO), fluorine-doped tin oxide (FTO), aluminumdoped zinc oxide (AZO), gallium doped ZnO (GZO), alumina and gallium co-doped ZnO (AGZO), boron doped ZnO (BZO), and any combination thereof. A suitable material for the front contact 112 can also be a composite material comprising at least one of the transparent conductive oxide (TCO) and another conductive material, which does not significantly decrease electrical conductivity or optical transparency of front contact layer 112. The thickness of front contact layer 112 is in the order of nanometers or microns, for example in the range of from 0.3 nm to 2.5 µm in some embodiments.

At step 210, photovoltaic device 100 is exposed to heat or radiation at a temperature from about 80° C. to about 500° C. for a period of time. In some embodiments, the radiation can be selected from the group consisting of microwave, infrared (IR) and ultraviolet (UV) light such as UV light having a wavelength in the range from 400 nm to 700 nm. The inventors have found that a moderate annealing using thermal energy or radiation excitation (or both) at step 210 increases the internal quantum efficiency of a photovoltaic device, through passivation of the junction and an increase in the depletion region in the p-n or n-p junction formed between absorber layer 106 and buffer layer 108. Step 210 provides a controlled and moderate diffusion of ions such as $Zn^{2+}$ or $Cd^{2+}$ from buffer layer 108 to absorber layer 106 to decrease or eliminate defects in absorber layer 106. Metal ions such as $Zn^{2+}$ or $Cd^{2+}$ diffuse into a thin layer 106-1 of absorber layer 106 adjacent to buffer layer 108 at the junction interface.

Step 210 is subsequent to at least step 206 of forming buffer layer 108 over absorber layer 106. In some embodiments, photovoltaic device 100 is exposed to the heat or radiation after step 208 of forming front transparent layer 110 over buffer layer 108. In some embodiments, photovoltaic device 100 is exposed to the heat or radiation after the step 212 of forming an anti-reflection layer 116 over front transparent layer 110 (described below). In some embodiments, performing step 210 after step 208 or after step 212 provides more desirable results.

In some embodiments, photovoltaic device 100 is exposed to the heat or radiation for a period of time from about 5 minutes to about 6 hours. In some embodiments, photovoltaic device 100 is exposed to the heat at a temperature in the range of from 100° C. to 300° C. for a period of time in the range of from about 20 minutes to about 2 hours. In some embodiments, photovoltaic device 100 is exposed to the heat at a temperature from about 100° C. to about 500° C. for multiple cycles in a total period of time in the range of from about 10 minutes to about 30 minutes. Each of the multiple cycles is a cycle in a rapid thermal process (RTP).

Photovoltaic device 100 can be also exposed to microwave at a temperature in the range of from about 200° C. to about 300° C. for a period of time in the range of from about 1 minute to about 10 minutes. In some other embodiments, photovoltaic device 100 is exposed to infrared light at a temperature in the range of from about 200° C. to about 400° C. for a period of time in the range of from 5 minutes to 60 minutes. Any combination thereof can be used in some embodiments.

In some embodiments, photovoltaic device 100 is exposed to heat or radiation at a temperature from about 80° C. to about 500° C., for example, from about 100° C. to about 300° C., for a period of time in the range of from about 10 minutes to about 3 hours, subsequent to the step of forming front transparent layer 110 over buffer layer 108.

At step 212, an anti-reflection layer 116 is formed over front transparent layer 110 in some embodiments. The resulting photovoltaic device 100 is illustrated in FIG. 1E. Examples of a suitable material for anti-reflection layer 116 include but are not limited to $SiO_2$ and $MgF_2$.

In some embodiments, photovoltaic device 100 is exposed to heat or radiation after step 212 of forming anti-reflection layer 116 over front transparent layer 110. In some embodiments, photovoltaic device 100 is annealed at a temperature in the range of from about 100° C. to about 300° C. for a period of time in the range of from about 20 minutes to about 2 hours. In some embodiments, photovoltaic device 100 is simultaneously exposed to a type of radiation in addition to the heat. The radiation is selected from microwave, infrared (IR), ultraviolet (UV) light, any other suitable radiation, and combinations thereof.

Figure 3A:
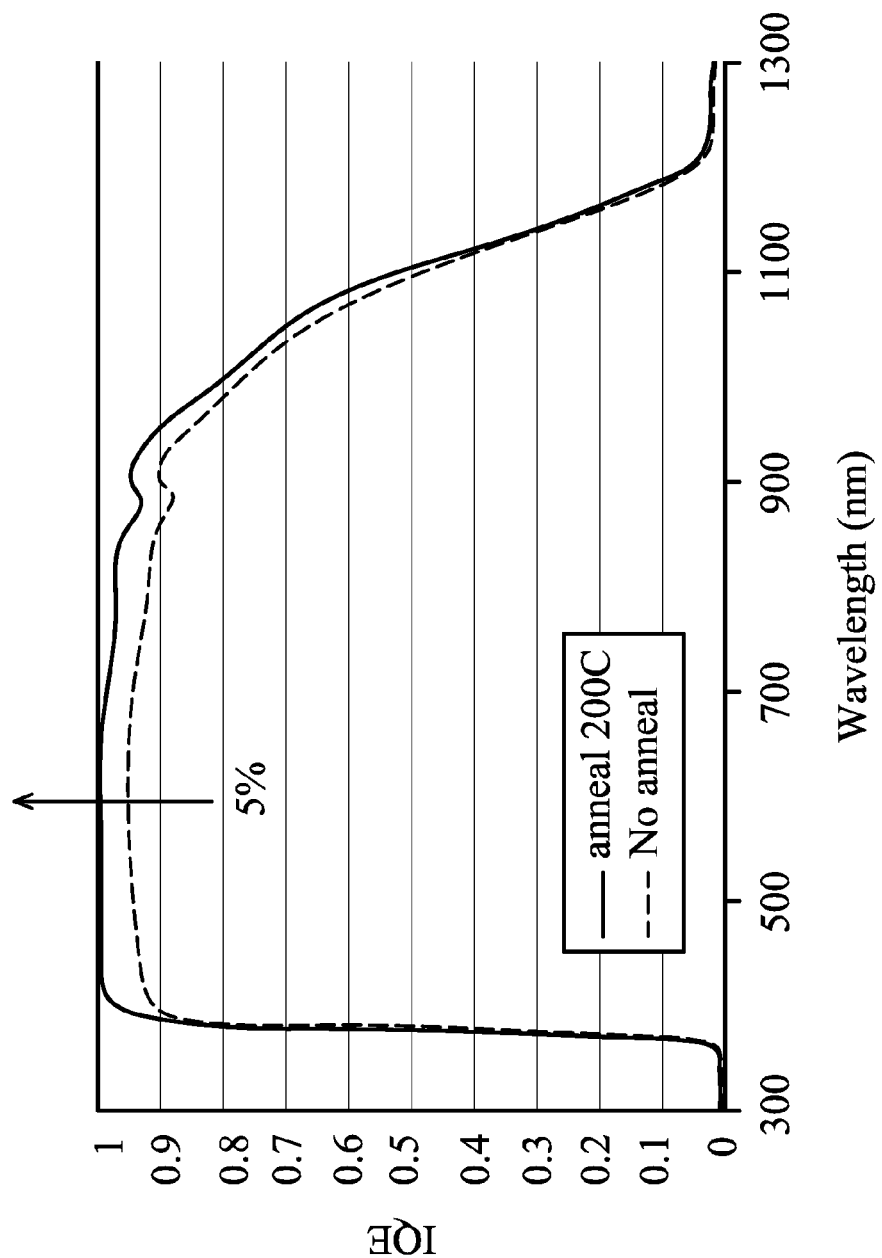
FIGS. 3A and 3B show results of internal quantum efficiency of a photovoltaic device comprising ZnS/CIGS layers without and with thermal annealing at 200° C. for 20 minutes.
Figure 3B:
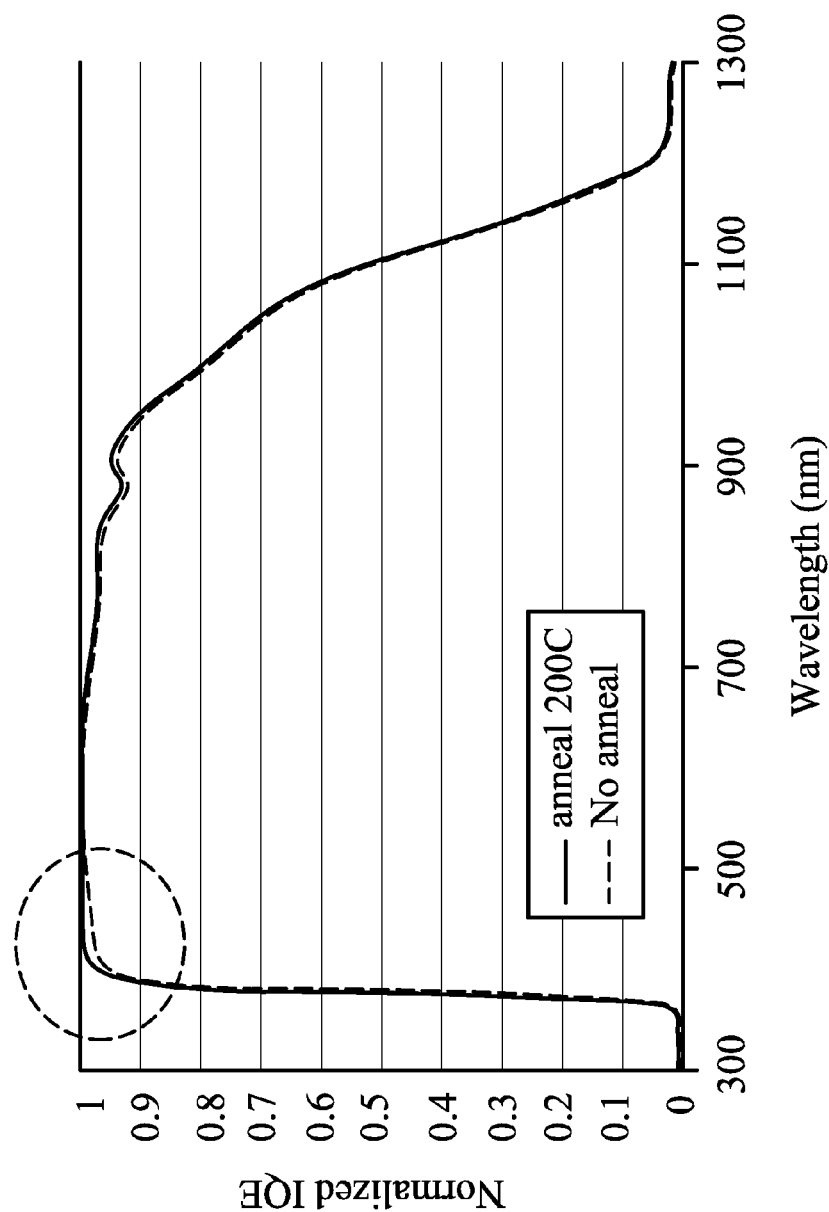

FIG. 3A shows results of internal quantum efficiency (IQE) of a photovoltaic device 100 having buffer layer 108 comprising ZnS and absorber layer 106 comprising CIGS without and with thermal annealing at 200° C. for 20 minutes in air after the formation of the device module. In the experiment, buffer layer 108 was deposited by chemical bath deposition (CBD) with the thickness of 100 nm. A furnace was used for thermal annealing in air after the formation of the device module. FIG. 3B shows the corresponding IQE normalized based on the IQE at a light wavelength of 600 nm. There is an improvement of 5% in IQE resulting from the thermal annealing and such an improvement results in significant improvement in the photo-carrier collection, the effective short circuit current and the conversion efficiency.

As shown in FIG. 3A, the IQE of photovoltaic device 100 increases significantly after device 100 is thermally annealed at 200° C. for 20 minutes in air. For example, in the light wavelength range of from 500 nm to 700 nm, the IQE increases from about 93% to about 98%. The average absolute increase of the IQE in the wavelength range from 400 nm to 1000 nm is 5%. The increase in the IQE after thermal annealing is due to the increase of depletion region resulting from passivation of the junction interface. As shown in FIG. 3B, the increase in the normalized IQE in the wavelength range from 300 nm to 400 nm indicates passivation of the junction interface after thermal annealing. The extra improvement in the normalized IQE at such a short wavelength region (300-400 nm) is correlated to the reduction in velocity of surface recombination.

Figure 4:
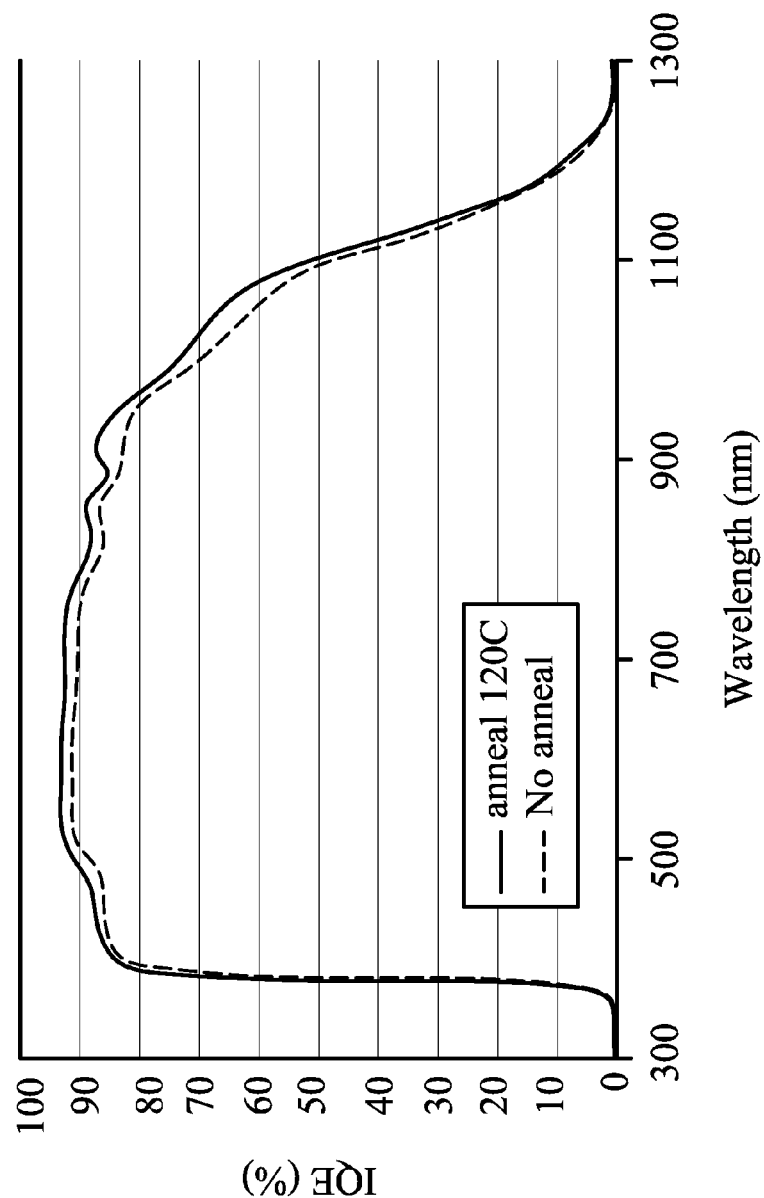
FIG. 4 shows results of internal quantum efficiency of a photovoltaic device comprising CdS/CIGS layers without and with thermal annealing at 200° C. for 20 minutes.

FIG. 4 shows results of the IQE of a photovoltaic device 100 having buffer layer 108 comprising CdS and absorber layer 106 comprising CIGS without and with thermal annealing at 200° C. for 20 minutes in air after the formation of the device module. The IQE of photovoltaic device 100 having CdS/CIGS layers increases by 2% after device 100 is thermally annealed at 200° C. for 20 minutes in air. The increase of 2% is the average absolute increase of the IQE in the wavelength range from 400 nm to 1000 nm.

FIGS. 5A and 5B illustrate a process of passivation in the junction after thermal or radiation treatment. As illustrated in FIG. 5A, absorber layer 106 comprising CIGS may contain defects ("x" in FIG. 5A) such as vacancies of copper ions in copper-poor CIGS. These defects can be at a concentration in the range of from $10^{12}$ per cubic centimeter ($cm^3$) to $10^{18}$ per $cm^3$ in some embodiments. The presence of these defects can decrease the IQE of the resulting photovoltaic device because of recombination in the junction. As shown in FIG. 5B, after moderate annealing using the conditions described in the present disclosure, a controlled and moderate diffusion of metal ions such as $Zn^{2+}$ or $Cd^{2+}$ occurs from buffer layer 108 to absorber layer 106. Such a diffusion results in decrease or elimination of the defects in absorber layer 106, i.e. passivation at the junction interface. Such diffusion also provides an increase in depletion region.

FIGS. 5A-5B are shown for the purpose of illustration only. In FIGS. 5A-5B, the junction is formed with a p-type semiconductor such as CIGS in absorber layer 106 and an n-type semiconductor such as ZnS in buffer layer 108. In some other embodiments, the junction is formed with an n-type semiconductor in absorber layer 106 and a p-type semiconductor in buffer layer 108. Other suitable negative or positive ions can be used to passivate the defects at the junction interface. In addition to a photovoltaic device having a p-n or n-p junction, the method described in the present disclosure can also be applied to a thin film semiconductor device or photovoltaic device having any p-n or n-p junction, p-i-n junction, metal-insulator-semiconductor (MIS) structure, multiple junctions and the like.

Figure 6:
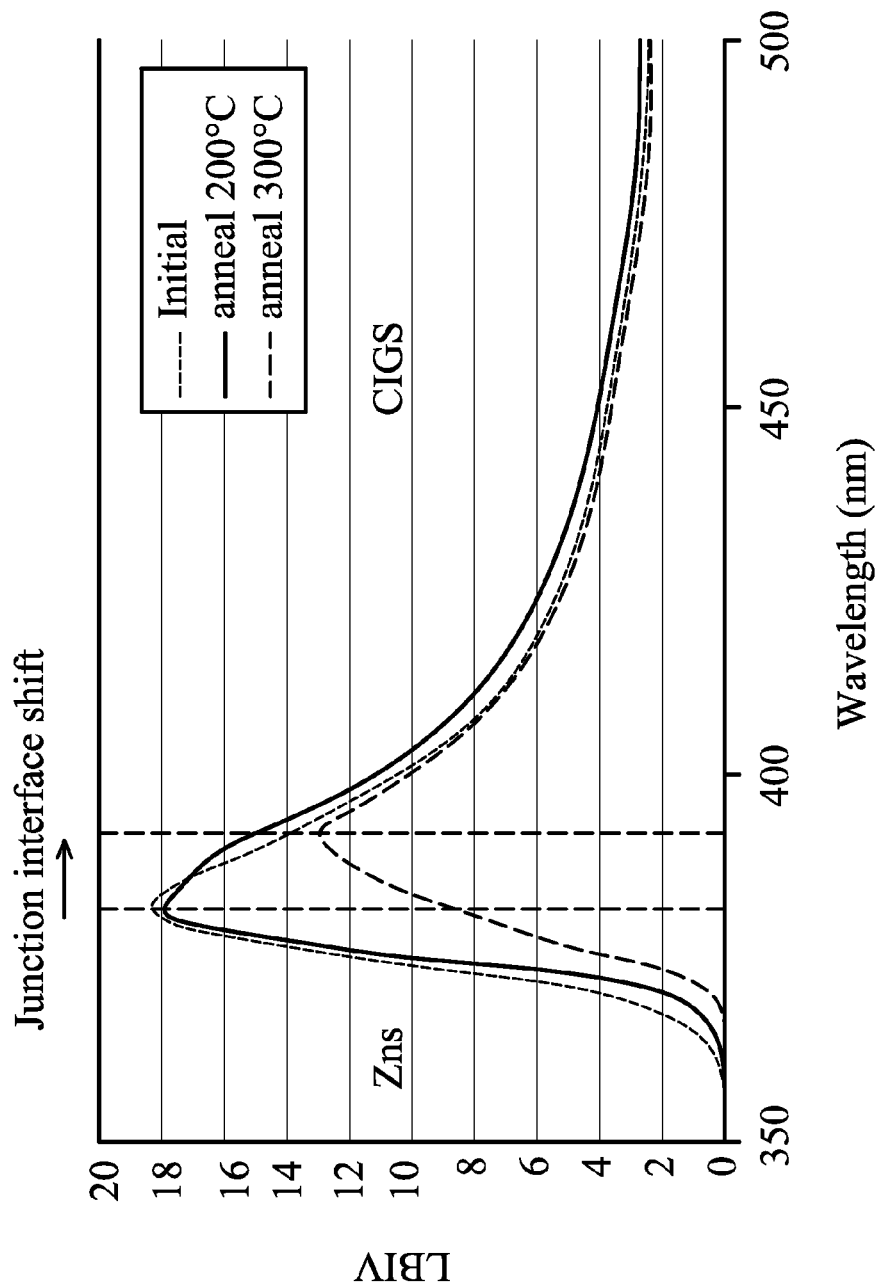
FIG. 6 shows a red shift of light beam induced voltage (LBIV) peak of a photovoltaic device after thermal annealing.

FIG. 6 shows a red shift of light beam induced voltage (LBIV) peak of a photovoltaic device having ZnS/CIGS layers after thermal annealing at 200° C. and 300° C. for 20 minutes in air after the formation of the device module. Such a red shift indicates a shift of the junction interface to absorber layer 106 resulting from diffusion of zinc ions. Meanwhile, the LBIV decreases after thermal annealing at 300° C. In some embodiments, both high IQE and high LBIV are desirable. The conditions for exposing a photovoltaic device to heat or radiation (or both) are chosen to achieve both high IQE and high LBIV.

The present disclosure also provides a photovoltaic device 100 in some embodiments. Photovoltaic device 100 comprises a substrate 102, a back contact layer 104 disposed above substrate 102, an absorber layer 106 comprising an absorber material disposed above back contact layer 104, and a buffer layer 108. These layers are described in FIGS. 1A-1E. For example, the absorber material can be selected from the group consisting of copper indium gallium selenide (CIGS) and cadmium telluride (CdTe) in some embodiments. Buffer layer 108 is disposed above absorber layer 106. Buffer layer 108 comprises a buffer material, which is selected from the group consisting of ZnS, CdS and CdSe in some embodiments. A thin layer 106-1 of absorber layer 106 adjacent to buffer layer 108, for example, the interface of the junction, comprises metal ions such as Zn or Cd ions, which diffuses from buffer layer 108. Photovoltaic device 100 can further comprise a front transparent layer 110 disposed above buffer layer 108 and an anti-reflection layer 116 disposed above front transparent layer 110. In some embodiments, the concentration of Zn or Cd ions in the area of absorber layer 106 adjacent to buffer layer 108 is in the range of from $10^{12}$ per cubic centimeter (cm$^3$) to $10^{18}$ per cm$^3$. The concentration of metal ions such as Zn or Cd ions depends on the concentration of defects at the junction interface in absorber layer 106 before step 210 described above. In some embodiments, the thickness of thin layer 106-1 in FIG. 1E is in the range of from 10 nm to 500 nm. This thin layer 106-1 represents the depth of the diffusion of metal ions into absorber layer 106.

In some embodiments, substrate 102 comprises a layer 101 comprising glass, and a layer 103 comprising silicon dioxide, which can be used to block possible diffusion of sodium in layer 101 comprising glass. In some embodiments, front transparent layer 110 can comprise two layers including a layer 112 comprising intrinsic ZnO (i-ZnO) and a front contact layer 114 comprising transparent conductive oxide (TCO) in some embodiments.

The present disclosure provides a method of fabricating a photovoltaic device. The method comprises the following steps: forming an absorber layer comprising an absorber material above a substrate, forming a buffer layer over the absorber layer, forming a front transparent layer over the buffer layer, and exposing the photovoltaic device to heat or radiation at a temperature from about 80° C. to about 500° C. for a period of time, subsequent to the step of forming a buffer layer over the absorber layer. The method can further comprise forming a back contact layer above a substrate before the step of forming the absorber layer above the substrate. In some embodiments, the photovoltaic device is exposed to the heat or radiation after the step of forming the front transparent layer over the buffer layer.

In some embodiments, the method further comprises forming an anti-reflection layer over the front transparent layer. In some embodiments, the photovoltaic device is exposed to the heat or radiation after the step of forming the anti-reflection layer over the front transparent layer. The radiation can be selected from the group consisting of microwave, infrared (IR) and ultraviolet (UV) light.

In some embodiments, the photovoltaic device is exposed to the heat or radiation for a period of time from about 5 minutes to about 6 hours. In some embodiments, the photovoltaic device is exposed to the heat at a temperature in the range of from 100° C. to 300° C. for a period of time in the range of from about 20 minutes to about 2 hours. In some embodiments, the photovoltaic device is exposed to the heat at a temperature from about 100° C. to about 500° C. for multiple cycles in a total period of time in the range of from about 10 minutes to about 30 minutes. The photovoltaic device can be also exposed to microwave at a temperature in the range of from about 200° C. to about 300° C. for a period of time in the range of from about 1 minute to about 10 minutes. In some other embodiments, the photovoltaic device is exposed to infrared light at a temperature in the range of from about 200° C. to about 400° C. for a period of time in the range of from 5 minutes to 60 minutes.

In some embodiments, the absorber material in the absorber layer is selected from the group consisting of copper indium gallium selenide (CIGS) and cadmium telluride (CdTe). The buffer layer comprises a buffer material selected from the group consisting of ZnS, CdS and CdSe.

In some embodiments, the present disclosure provides a method of fabricating a photovoltaic device comprising the following steps: forming a back contact layer above a substrate, forming an absorber layer comprising an absorber material above the substrate, forming a buffer layer over the absorber layer, forming a front transparent layer over the buffer layer, and exposing the photovoltaic device to heat or radiation at a temperature from about 80° C. to about 500° C. for a period of time in the range of from about 10 minutes to about 3 hours, subsequent to the step of forming the front transparent layer over the buffer layer.

The method can further comprise forming an anti-reflection layer over the front transparent layer. In some embodiments, the photovoltaic device is exposed to heat or radiation after the step of forming the anti-reflection layer over the front transparent layer. In some embodiments, the photovoltaic device is exposed to heat at a temperature in the range of about 100° C. to about 300° C. for a period of time in the range of from about 20 minutes to about 2 hours. In some embodiments, the photovoltaic device is simultaneously exposed to a type of radiation. The radiation is selected from the group consisting of microwave, infrared (IR) and ultraviolet (UV) light.

The present disclosure also provides a photovoltaic device comprising a substrate, a back contact layer disposed above the substrate, an absorber layer comprising an absorber material disposed above the back contact layer, and a buffer layer. The absorber material can be selected from the group consisting of copper indium gallium selenide (CIGS) and cadmium telluride (CdTe). The buffer layer is disposed above the absorber layer. The buffer layer comprises a buffer material, which is selected from the group consisting of ZnS, CdS and CdSe in some embodiments. A thin layer of the absorber layer adjacent to the buffer layer comprises Zn or Cd ions. The photovoltaic device can further comprise a front transparent layer disposed above the buffer layer and an anti-reflection layer disposed above the front transparent layer. In some embodiments, the concentration of Zn or Cd ions in the area of the absorber layer adjacent to the buffer layer is in the range of from $10^{12}$ per cubic centimeter (cm$^3$) to $10^{18}$ per cm$^3$.

Although the subject matter has been described in terms of exemplary embodiments, it is not limited thereto. Rather, the appended claims should be construed broadly, to include other variants and embodiments, which may be made by those skilled in the art.

What is claimed is:

1. A method of fabricating a photovoltaic device, comprising forming an absorber layer comprising an absorber material above a substrate;
    forming a buffer layer over the absorber layer;
    forming a front transparent layer over the buffer layer; and
    exposing the photovoltaic device to heat or radiation at a temperature from about 100° C. to about 500° C. for multiple cycles in a total period of time in the range of from about 10 minutes to about 30 minutes, subsequent to the step of forming a buffer layer over the absorber layer.

2. The method of claim 1, further comprising:
    forming a back contact layer above the substrate before the step of forming the absorber layer above the substrate.

3. The method of claim 1, wherein
    the photovoltaic device is exposed to the heat or radiation after the step of forming the front transparent layer over the buffer layer.

4. The method of claim 1, further comprising:
    forming an anti-reflection layer over the front transparent layer.

5. The method of claim 4, wherein
    the photovoltaic device is exposed to the heat or radiation after the step of forming the anti-reflection layer over the front transparent layer.

6. The method of claim 1, wherein
    the radiation is selected from the group consisting of microwave, infrared (IR) and ultraviolet (UV) light.

7. The method of claim 1, wherein
    the photovoltaic device is exposed to the heat at a temperature in the range of from 100° C. to 300° C.

8. The method of claim 1, wherein
    the photovoltaic device is exposed to microwave as the radiation at a temperature in the range of from about 200° C. to about 300° C.

9. The method of claim 1, wherein
    the photovoltaic device is exposed to infrared light as the radiation at a temperature in the range of from about 200° C. to about 400° C.

10. The method of claim 1, wherein
    the absorber material in the absorber layer is selected from the group consisting of copper indium gallium selenide (CIGS) and cadmium telluride (CdTe); and
    the buffer layer comprises a buffer material selected from the group consisting of ZnS, CdS and CdSe.

11. A method of fabricating a photovoltaic device, comprising
    forming a back contact layer above a substrate;
    forming an absorber layer comprising an absorber material above the substrate;
    forming a buffer layer over the absorber layer;
    forming a front transparent layer over the buffer layer; and
    exposing the photovoltaic device to heat or radiation at a temperature from about 100° C. to about 500° C. for multiple cycles in a total period of time in the range of from about 10 minutes to about 30 minutes, subsequent to the step of forming the front transparent layer over the buffer layer.

12. The method of claim 11, further comprising:
    forming an anti-reflection layer over the front transparent layer.

13. The method of claim 11, wherein
    the photovoltaic device is exposed to heat or radiation after the step of forming the anti-reflection layer over the front transparent layer.

14. The method of claim 11, wherein
    the photovoltaic device is exposed to the heat at a temperature in the range of from about 100° C. to about 300° C.

15. The method of claim 14, wherein
    the photovoltaic device is simultaneously exposed to a type of radiation in addition to the heat, the radiation being selected from the group consisting of microwave, infrared (IR) and ultraviolet (UV) light.

* * * * *